United States Patent [19]

Kamura et al.

[11] Patent Number: 5,260,603
[45] Date of Patent: Nov. 9, 1993

[54] ELECTRODE STRUCTURE OF SEMICONDUCTOR DEVICE FOR USE IN GAAS COMPOUND SUBSTRATE

[75] Inventors: Mayumi Kamura, Tokyo; Souichi Imamura, Yokohama; Tatsuo Akiyama, Tokyo, all of Japan

[73] Assignee: Kabushiki Kaisha Toshiba, Kawasaki, Japan

[21] Appl. No.: 942,136

[22] Filed: Sep. 8, 1992

Related U.S. Application Data

[63] Continuation of Ser. No. 645,417, Jan. 24, 1991, abandoned.

[30] Foreign Application Priority Data

Jan. 25, 1990 [JP] Japan ................................. 2-15229

[51] Int. Cl.$^5$ ..................... H01L 23/48; H01L 29/46; H01L 29/54; H01L 29/62
[52] U.S. Cl. .................................. 257/745; 257/748; 257/757; 257/763; 257/764; 257/768; 257/769; 257/781
[58] Field of Search ....................... 357/71, 68, 51, 67, 357/65, 75; 257/736, 743, 744, 745, 746, 748, 750, 751, 753, 757, 758, 763, 764, 768, 769, 770, 781

[56] References Cited

U.S. PATENT DOCUMENTS 4,188,636  2/1980  Sato et al. .............................. 357/68
4,197,551  4/1980  Adlerstein .............................. 357/75

Primary Examiner—Jerome Jackson
Assistant Examiner—Carl Whitehead, Jr.
Attorney, Agent, or Firm—Finnegan, Henderson, Farabow, Garrett & Dunner

[57] ABSTRACT

A semiconductor device having a GaAs substrate and an ohmic electrode. An electrode pad is on part of the ohmic electrode and on part of the GaAs substrate outside the ohmic electrode. The electrode pad includes a first platinum film, a titanium film, a second platinum film, and a gold film which are sequentially deposited on one another. The first platinum film is thinner than each of the titanium film, second platinum film and gold film.

8 Claims, 2 Drawing Sheets

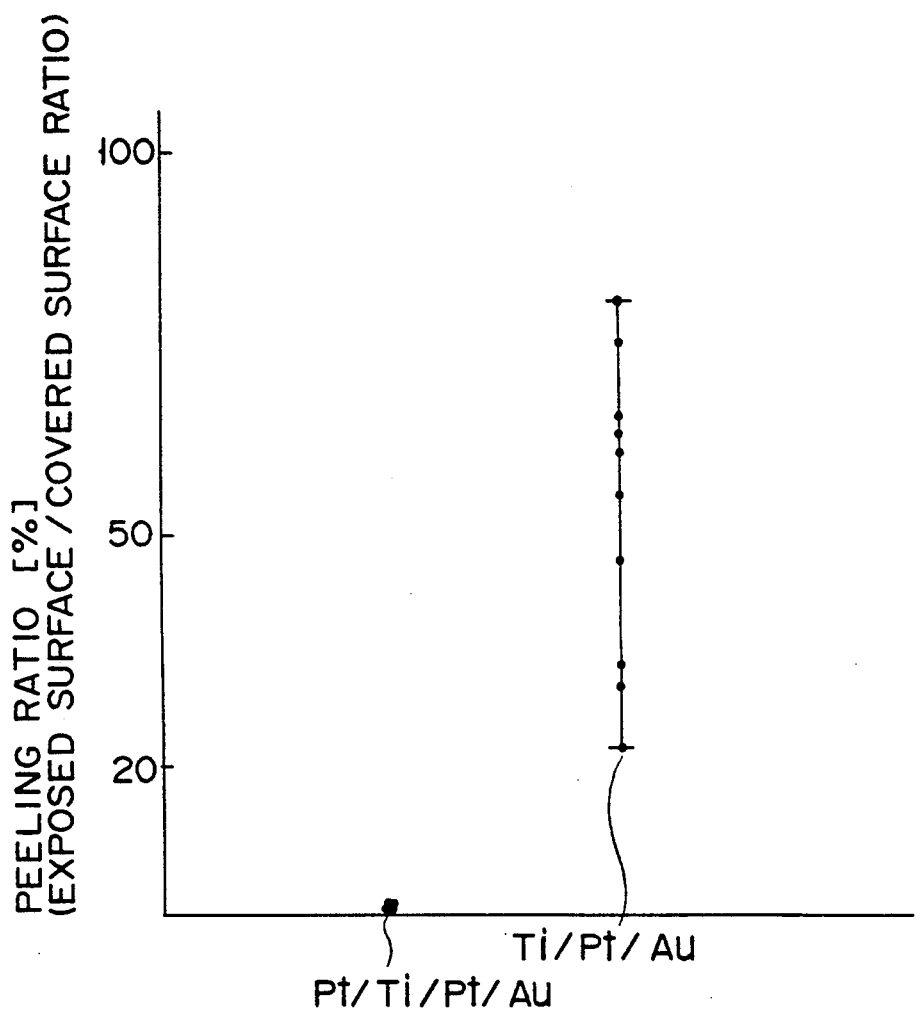
F I G. 3

ELECTRODE STRUCTURE OF SEMICONDUCTOR DEVICE FOR USE IN GAAS COMPOUND SUBSTRATE

This application is a continuation of application Ser. No. 07/645,417, filed Jan. 24, 1991, now abandoned.

BACKGROUND OF THE INVENTION

1. Field of the Invention

The present invention relates to an electrode structure of a semiconductor device, which is applied to a semiconductor substrate formed of a compound such as GaAs.

2. Description of the Related Art

According to a conventional electrode structure of a semiconductor device using a gallium arsenic (GaAs) substrate, generally, titanium (Ti), platinum (Pt), and gold (Au) are deposited in sequence on the GaAs substrate. For example, an electrode pad of a semiconductor device has this structure.

If, however, the electrode pad has such an electrode structure and the well-known wire bonding is performed, the electrode pad peels off the GaAs substrate the because of tension caused when wires are formed. Since the titanium almost always peels off the GaAs substrate, its adhesiveness to the GaAs substrate is very poor. Thus, a defective in electrode occurs in semiconductor devices having a GaAs substrate, thereby causing the yield to be lowered.

SUMMARY OF THE INVENTION

It is accordingly an object of the present invention to provide an electrode structure of a semiconductor device which prevents an electrode from peeling off because of the tension caused at the time of wire bonding and eliminates a defect in the electrode, thus improving yield.

To attain the above object, there is provided an electrode structure of a semiconductor device, comprising: a first platinum film formed on a semiconductor substrate; a titanium film formed on the first platinum film; a second platinum film formed on the titanium film; and a gold film formed on the second platinum film.

With the above structure, titanium is not directly deposited on the substrate but the first platinum film is formed between the substrate and the titanium film, thereby enhancing the adhesiveness between the titanium film and the substrate. Since the first platinum film is very adherent to titanium, the titanium film hardly peels off the substrate at the time of wire bonding. Even though the first platinum film is very thin, an effect is sufficiently obtained and the resistance is almost equal to that of the conventional electrode structure.

Additional objects and advantages of the invention will be set forth in the description which follows, and, in part, will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a graph showing the peeling ratios of pads of the present invention and the prior art at the time of wire bonding.

DETAILED DESCRIPTION OF THE PREFERRED EMBODIMENTS

An embodiment of the present invention will be described with reference to the accompanying drawings.

Figure 1:
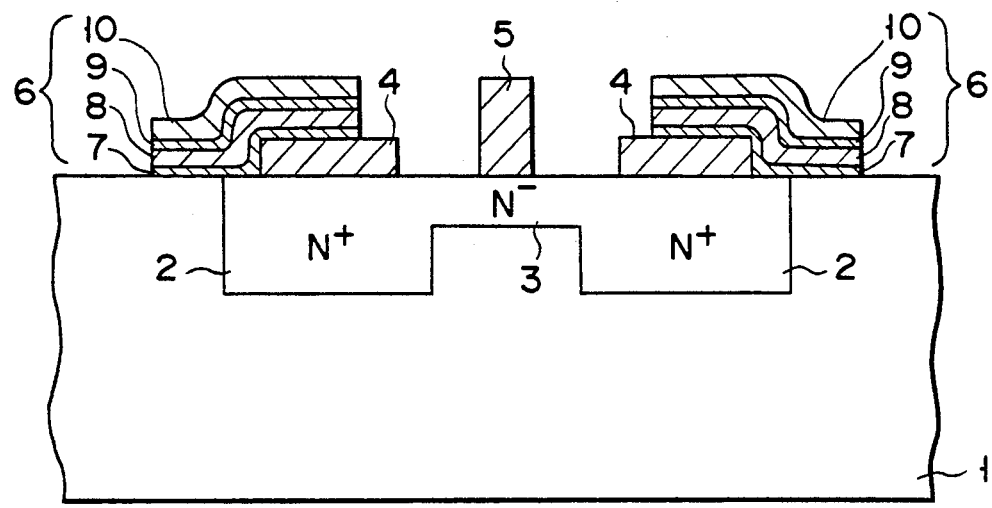
FIG. 1 is a cross-sectional view showing an electrode structure of a semiconductor device according to an embodiment of the present invention.

FIG. 1 is a cross-sectional view showing a metal semiconductor field effect transistor (MES FET) using a gallium arsenic (GaAs) substrate having an electrode structure of a semiconductor device according to the embodiment of the present invention.

An N-type high-concentration impurity is doped into the surface of a GaAs substrate 1 to form an $N^+$-type region 2. An impurity whose concentration is lower than that of the N-type impurity, is doped into the $N^+$-type region 2 to form an $N^-$-type region 3 in the middle of the $N^+$-type region 2. An ohmic electrode 4 composed of AuGe or the like, which is brought into an ohmic contact with N-type GaAs, is formed on the $N^+$-type region 2. A gate electrode 5 composed of aluminum, titanium, or the like, which is put in Schottky contact with the N-type GaAs, is formed on the $N^-$-type region 3.

An electrode pad 6 is formed on part of the ohmic electrode 4 and the GaAs substrate 1 outside the ohmic electrode. The electrode pad 6 has the structure including platinum film 7, titanium film 8, platinum film 9, and gold film 10 which are sequentially deposited one on another. With this structure, the electrode pad can be firmly adhered to the GaAs substrate without directly depositing titanium, which does not have good adhesiveness, on the substrate. Since platinum has good adhesiveness to both the titanium and GaAs substrate, electrode pad 6 can be formed so that its resistance is virtually the same as that of the conventional electrode structure. Even when wires are bonded to electrode pad 6, no electrodes peel off the GaAs substrate.

A method for forming an electrode pad on the MES FET having the structure shown in FIG. 1 will be described with reference to FIGS. 2A and 2B.

Figure 2A:
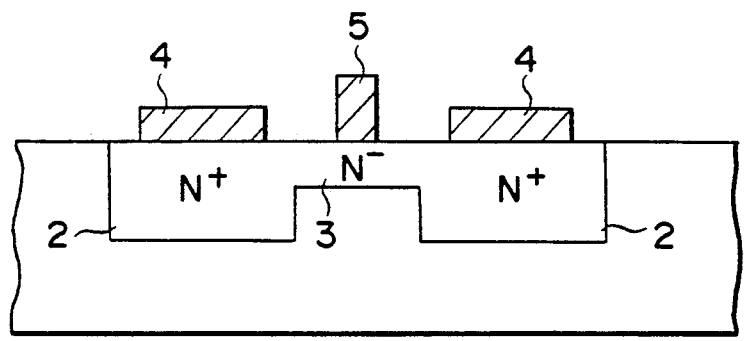
FIGS. 2A and 2B are cross-sectional views sequentially showing steps of manufacturing an electrode pad of the semiconductor device shown in FIG. 1.

As shown in FIG. 2A, an N-type semiconductor region is formed on the GaAs substrate 1 by ion-implantation or the like. The gate electrode 5 is selectively formed on the N-type semiconductor region. A desired resist film is formed on the gate electrode 5 and on both sides of the gate electrode 5. An N-type impurity is ion-implanted at a large dose while using the resist film as a mask. The resultant structure is thermally treated to activate the impurity and thus form the $N^+$-type region 2 and $N^-$-type region 3. After that, the ohmic electrode 4 is selectively formed on the $N^+$-type region 2.

Figure 2B:
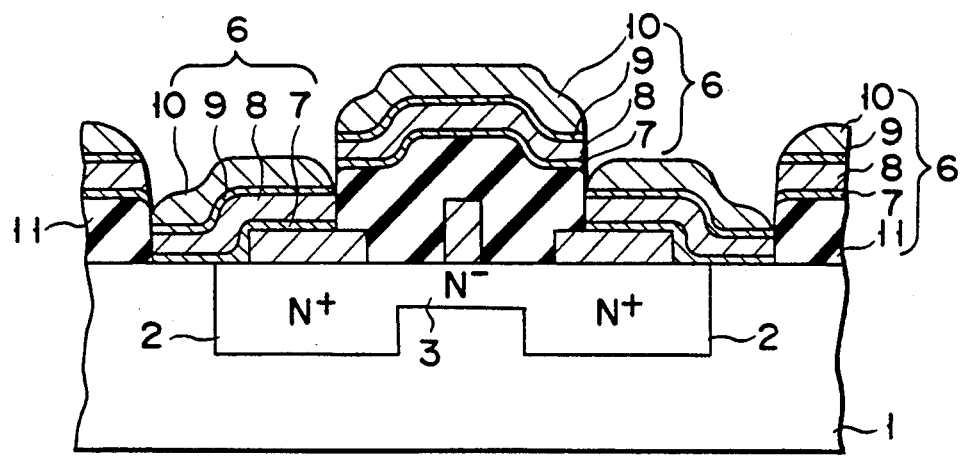

As illustrated in FIG. 2B, after a predetermined region is covered with photoresist film 11, a platinum film 7 having a thickness ranging from 0.5 nm to 5 nm, e.g., 2 nm, a titanium film 8 having a thickness ranging from 10 nm to 100 nm, e.g., 100 nm, a platinum film 9 having a thickness ranging from 20 nm to 100 nm, e.g., 30 nm, and a gold film 10 having a thickness ranging from 30 nm to 1000 nm, e.g., 800 nm are sequentially deposited one on another in a furnace, thereby completing en electrode pad.

The photoresist film 11 is dipped into an organic solvent and eliminated. Thus, the above metal films formed on the photoresist film 11 undergo the lift-off etching and the electrode pad 6 is formed as shown in FIG. 1.

Conventionally, the electrode pad is formed by sequentially depositing a titanium film having a thickness of about 100 nm, a platinum film having a thickness of about 30 nm, and a gold film having a thickness of about 80 nm on a GaAs substrate. For this reason, in order to cause the resistance or the like of the electrode structure of the present invention to differ from that of the conventional electrode structure, the platinum film 7 formed on the GaAs substrate 1 of the electrode pad 6 has a very small thickness of about 2 nm. The thin platinum film 7 can be deposited on the GaAs substrate if its growing speed is slow, e.g., 0.4 Å/sec.

FIG. 3 is a graph showing the peeling ratios of electrode pads of the present invention and the prior art at the time of wire bonding. The peeling ratios are obtained by inspecting one-thousand electrode pads ten times. The conventional electrode pad includes a titanium film, a platinum film and a gold film deposited in sequence on a substrate and its peeling rate is plotted in line on the right hand of FIG. 3. It is understood from FIG. 3 that the peeling rate of the conventional electrode pad widely varies from 20 to 80% and is, thus, unstable. Since the electrode pad of the above embodiment, whose peeling rate is plotted on the left hand of FIG. 3, includes only a platinum film between the GaAs substrate and titanium film, it hardly peels off the electrode. A great effect can thus be obtained from the present invention.

As described above, the present invention can provide an electrode structure of a semiconductor device in which a platinum film is deposited on a substrate, and a titanium film, a platinum film and a gold film are sequentially deposited on the platinum film thereby to enhance the adhesiveness between the titanium film and the substrate, and to improve the yield of the semiconductor device.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electrode structure of a MES FET on a GaAs compound semiconductor substrate, comprising:
   an ohmic electrode of the MES FET on the substrate; and
   an electrode pad connected to said ohmic electrode and having a bonding region broader than said ohmic electrode so as to be electrically connected to an outer wiring;
   said electrode pad including:
   a first platinum film on a top surface and a side surface of said ohmic electrode and on a top surface of said substrate;
   a titanium film on said first platinum film;
   a second platinum film on said titanium film; and
   a gold film on said second platinum film.

2. The electrode structure according to claim 1, wherein said first platinum film is much thinner than each of said titanium, second platinum and gold films.

3. An electrode structure of a MES FET on a GaAs compound semiconductor substrate, comprising:
   an ohmic electrode of the MES FET; and
   an electrode pad connected to said ohmic electrode and having a bonding region broader than said ohmic electrode so as to be electrically connected to an outer wiring;
   said electrode pad including:
   a first platinum film having a thickness of 0.5 nm to 5 nm over a top surface and a side surface of said ohmic electrode and on a top surface of said substrate;
   a titanium film having a thickness of 10 nm to 100 nm on said first platinum film;
   a second platinum film having a thickness of 20 nm to 100 nm on said titanium film; and
   a gold film having a thickness of 30 nm to 1000 nm on said second platinum film.

4. An electrode on a GaAs compound semiconductor device, the electrode and the semiconductor device having a bond able to resist a force applied to the electrode tending to pull it away from the semiconductor device, the electrode comprising:
   a first platinum film on a GaAs substrate, said first platinum film strengthening adhesiveness to the GaAs substrate and having a thickness not substantially affecting the electric resistance of said electrode;
   a titanium film on a substantial part of said first platinum film;
   a second platinum film on a substantial part of said titanium film; and
   a gold film on a substantial part of said second platinum film.

5. An electrode for a MES FET on GaAs compound semiconductor substrate, the electrode and the semiconductor substrate having a bond able to resist a force applied to the electrode tending to pull it away from the semiconductor substrate, the electrode comprising:
   an ohmic electrode on the semiconductor substrate;
   a first platinum film on said ohmic electrode and extending onto the semiconductor substrate, said first platinum film strengthening adhesiveness to the semiconductor substrate and having a thickness not substantially affecting the electric resistance of said electrode;
   a titanium film on a substantial part of said first platinum film;
   a second platinum film on a substantial part of said titanium film; and
   a gold film on a substantial part of said second platinum film.

6. An electrode structure of MES FET formed on GaAs compound semiconductor substrate, comprising:
   a Schottky barrier gate electrode of the MES FET on said substrate;
   two ohmic electrodes on said substrate and located on opposite sides of said Schottky barrier gate electrode; and
   an electrode pad connected to each of said ohmic electrodes, each electrode pad having a bonding region larger than the bonding region of said corresponding ohmic electrode thereby facilitating connection to an outer wiring;
   each of said electrode pads including:

a first platinum film on a top surface and a side surface of said corresponding ohmic electrode and on a surface of said electric substrate;
a titanium film on said first platinum film;
a second platinum film on said titanium film; and
a gold film on said second platinum film.

7. The electrode structure according to claim 6, wherein said first platinum film is much thinner than each of said titanium, second platinum and gold films.

8. An electrode structure of a MES FET on a GaAs compound semiconductor substrate, comprising:
a Schottky barrier gate electrode of the MES FET on said substrate;
two ohmic electrodes on said substrate and located on opposite sides of said Schottky barrier gate electrode; and
an electrode pad connected to each of said ohmic electrodes, each of said electrode pads having a bonding area larger than the bonding area of said corresponding ohmic electrode thereby facilitating connection to an outer wiring;
each of said electrode pads including:
a first platinum film on a top surface and a side surface of each ohmic electrode and on a surface of said substrate;
a first platinum film having a thickness of 0.5 nm to 5 nm on a surface of said corresponding ohmic electrode and extending onto the substrate outside said corresponding ohmic electrode;
a titanium film having a thickness of 10 nm to 100 nm on said first platinum film;
a second platinum film having a thickness of 20 nm to 100 nm on said titanium film; and
a gold film having a thickness of 30 nm to 1000 nm on said second platinum film.

* * * * *